(12) United States Patent
Iwasaki (10) Patent No.: US 6,634,092 B1
(45) Date of Patent: Oct. 21, 2003

(54) APPARATUS FOR REPLACING PARTS CONNECTED TO CIRCUIT BOARD

(75) Inventor: Nobuyuki Iwasaki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/290,201

(22) Filed: Apr. 13, 1999

(30) Foreign Application Priority Data

Apr. 13, 1998 (JP) .......................................... 10-101057

(51) Int. Cl.[7] ................................................ H05K 3/30
(52) U.S. Cl. .............................. 29/740; 29/739; 29/741; 29/760; 29/762; 29/832; 29/840; 29/839; 29/402.01; 29/402.03; 29/402.08; 198/341.07; 228/119; 228/264
(58) Field of Search .................. 29/740, 762, 829, 29/739, 741, 760, 832, 839, 840, 402.01, 402.03, 402.08; 198/341.07; 228/119, 264

(56) References Cited

U.S. PATENT DOCUMENTS

| | | | | |
|---|---|---|---|---|
| 4,813,589 A | * | 3/1989 | Palmer et al. .............. | 228/119 |
| 4,845,843 A | * | 7/1989 | Babcock ...................... | 29/829 |
| 4,868,979 A | * | 9/1989 | Fukushima et al. .......... | 29/840 |
| 4,954,453 A | * | 9/1990 | Venutolo ..................... | 29/762 |
| 5,152,056 A | | 10/1992 | Shook ......................... | 29/840 |
| 5,495,661 A | * | 3/1996 | Gromer et al. ............... | 29/740 |
| 5,560,100 A | * | 10/1996 | Englert ..................... | 29/740 X |
| 5,601,675 A | | 2/1997 | Hoffmeyer et al. ........... | 156/94 |
| 5,680,936 A | * | 10/1997 | Beers ......................... | 209/564 |
| 5,729,892 A | * | 3/1998 | Umemura et al. ......... | 29/740 X |
| 5,932,081 A | * | 8/1999 | Kopp et al. ............ | 198/341.07 |

\* cited by examiner

*Primary Examiner*—Richard Chang
(74) *Attorney, Agent, or Firm*—Sughrue Mion, PLLC

(57) ABSTRACT

A flash circuit board in a lens-fitted photo film unit includes a board part, and a battery contact part connected to the board part by solder. A part exchanging apparatus for the circuit board includes an eliminating unit, which melts the solder, and removes the battery contact part from the board part while the solder is melted. An assembling unit mounts an unused battery contact part on the board part. The unused battery contact part has an unused form of the first battery contact part. A soldering unit connects the unused battery contact part to the board part by use of solder.

18 Claims, 6 Drawing Sheets

APPARATUS FOR REPLACING PARTS CONNECTED TO CIRCUIT BOARD

BACKGROUND OF THE INVENTION

1. Field of the Invention

The present invention relates to a part exchanging apparatus and method for a circuit board. More particularly, the present invention relates to an apparatus for exchanging or replacing a portion in which a part of a circuit board can be renewed with high efficiency for the purpose of recycling the circuit board.

2. Description Related to the Prior Art

A lens-fitted photo film unit is sold in a form provided with a simple structure for taking an exposure, and loaded with unexposed photo film. The lens-fitted photo film unit is widely used particularly for the reason that any user can take photographs with the lens-fitted photo film unit without difficulty after he or she purchases it.

The lens-fitted photo film unit includes a main body, an exposure unit, a front cover and a rear cover. The main body has a cassette holder chamber for containing a cassette, and a roll holder chamber for containing a roll of photo film drawn from the cassette. The exposure unit is provided with a taking lens and a shutter blade. A front cover covers the front of the main body. A rear cover covers the rear of the main body. Each of those parts are formed from resin, and assembled together by engagement of claws or hooks.

A flash built-in type of the lens-fitted photo film unit is known, and used for photographing a dark scene, such as a scene indoors or at night. This type incorporates a flash circuit board, to which various parts are soldered, including a flash discharge tube, a main capacitor, a battery holder, and the like.

The lens-fitted photo film unit, after being used, is forwarded to a photo laboratory, where an exposed photo film is removed from the lens-fitted photo film unit. Then the lens-fitted photo film unit is withdrawn by each manufacturer and disassembled into parts. Some parts including the front and rear covers and the main body are pelleted, and regenerated as raw material to be reused. The exposure unit and the flash circuit board are subjected to inspection of appearance and performance. Some of the parts of the exposure unit and the flash circuit board, if desired, are replaced with new parts to be reused. The exposure unit and the flash circuit board, after the reconstruction, are mounted on a new main body to be recycled.

However manual operation required in reconstructing the flash circuit board including, steps of solder between an unacceptable part and a board part of the flash circuit board, removing the unacceptable part, and then soldering a new part to the board part of the flash circuit board in place of the unacceptable part. Manual handling for this sequential operation is extremely difficult. A long time is also required for the exchange of the part.

SUMMARY OF THE INVENTION

In view of the foregoing problems, an object of the present invention is to provide a part exchanging apparatus and method in which a part of a circuit board can be automatically renewed to eliminate difficulties in manual handling and reducing time for the renewal.

In order to achieve the above and other objects and advantages of this invention, a part exchanging apparatus and method for a circuit board is provided, the circuit board including a board part, and at least one first part connected to the board part by solder. The part exchanging apparatus includes an eliminating unit for melting the solder, and for removing the first part from the board part while the solder is melted. An assembling unit mounts a second part on the board part supplied from the eliminating unit, the second part having an unused form of the first part. A soldering unit connects the second part to the board part supplied from the assembling unit by use of solder.

Furthermore, a conveyor conveys the circuit board along a predetermined conveying path. The assembling unit is disposed downstream from the eliminating unit with reference to the conveying path, and the soldering unit is disposed downstream from the assembling unit with reference to the conveying path.

The conveying path is loop-shaped, and the conveyor moves the circuit board along the conveying path. Furthermore, a supplying unit is disposed upstream from the eliminating unit with reference to the conveying path, for supplying the conveying path with the circuit board. An ejecting unit is disposed downstream from the soldering unit with reference to the conveying path, for ejecting a combination of the board part and the second part from the conveying path.

Furthermore, there is a board holder on which the board part of the circuit board is mounted, and which is moved cyclically along the conveying path by the conveyor. The first and second parts are removed or mounted while the board part is mounted on the board holder.

Furthermore, an inspecting unit is disposed between the soldering unit and the ejecting unit along the conveying path, for determining whether an mounted state between the board part and the second part is acceptable or unacceptable.

The circuit board includes first and second battery contact parts, the first battery contact part having first and second ends, the second battery contact part having third and fourth ends, the first and third ends being connected to the board part, the second and fourth ends being adapted to contact with terminals of a battery. The first and second parts are the first battery contact part.

Furthermore, a controller controls the conveyor and the ejecting unit in accordance with the. mounted state determined by the inspecting unit, the controller, if the mounted state is acceptable, driving the ejecting unit, and if the mounted state is unacceptable, inducing the conveyor to convey the combination of the board part and the second part past the ejecting unit, for supplying the eliminating unit therewith.

The first battery contact part is longer than the second battery contact part.

The circuit board is a flash circuit board.

The eliminating unit includes a heater for melting the solder by application of heat. A shifter shifts the first part away from the board part when the solder is melted.

The heater is a hot air heater for applying hot air to the solder.

The conveyor is an endless conveyor.

By this construction, a part of a circuit board can be automatically renewed, to eliminate difficulties in manual handling and reducing time for the renewal.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1:
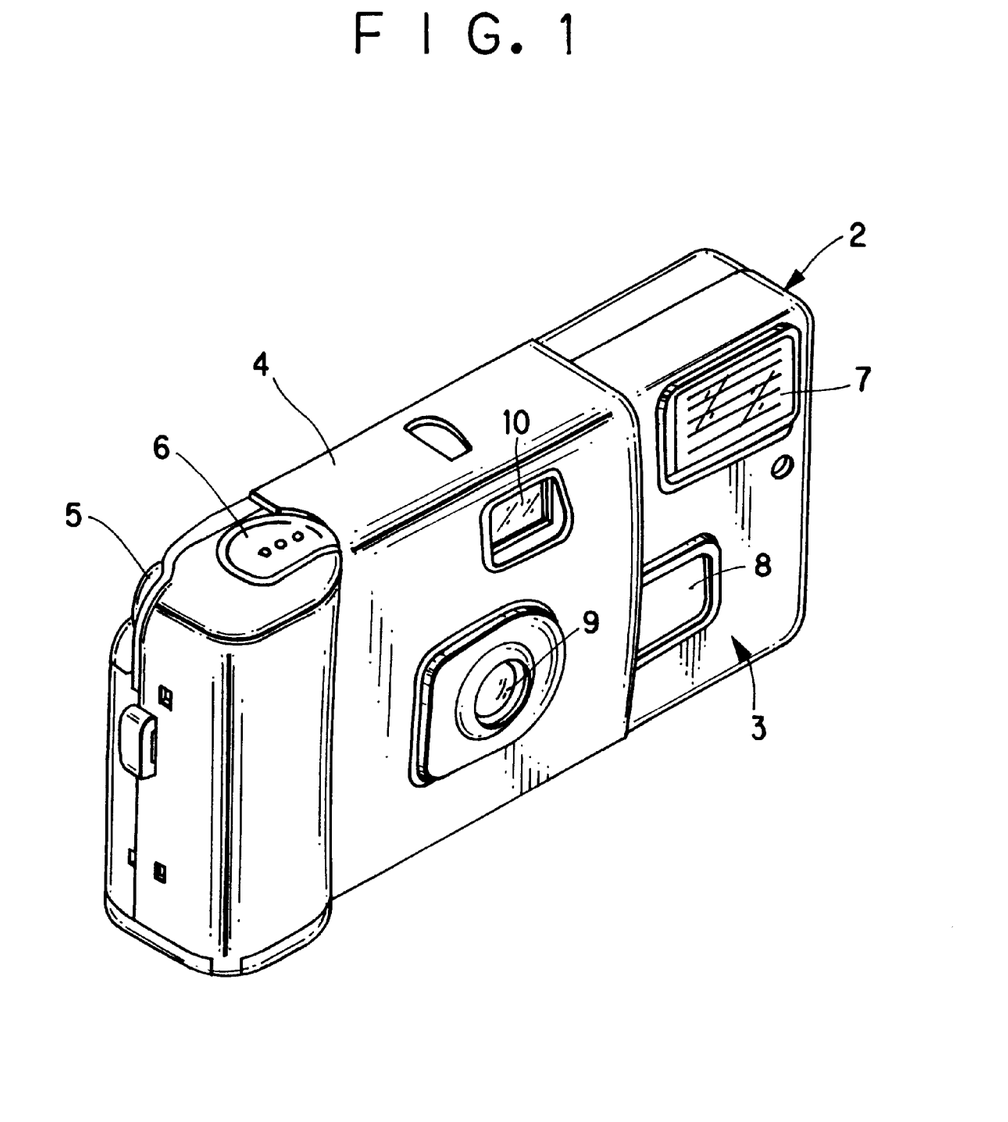
FIG. 1 is a perspective illustrating a lens-fitted photo film unit.

In FIG. 1, a lens-fitted photo film unit 2 is constituted by a housing 3 and a wrapper belt 4. The housing 3 is pre-loaded with a photo film cassette, and incorporates various mechanisms for taking exposures. The wrapper belt 4 partially covers the housing 3. Also the housing 3 includes a winder wheel 5, a shutter release button 6, a flash emitter 7, a charger button 8, a taking lens 9 and a viewfinder 10.

Figure 2:
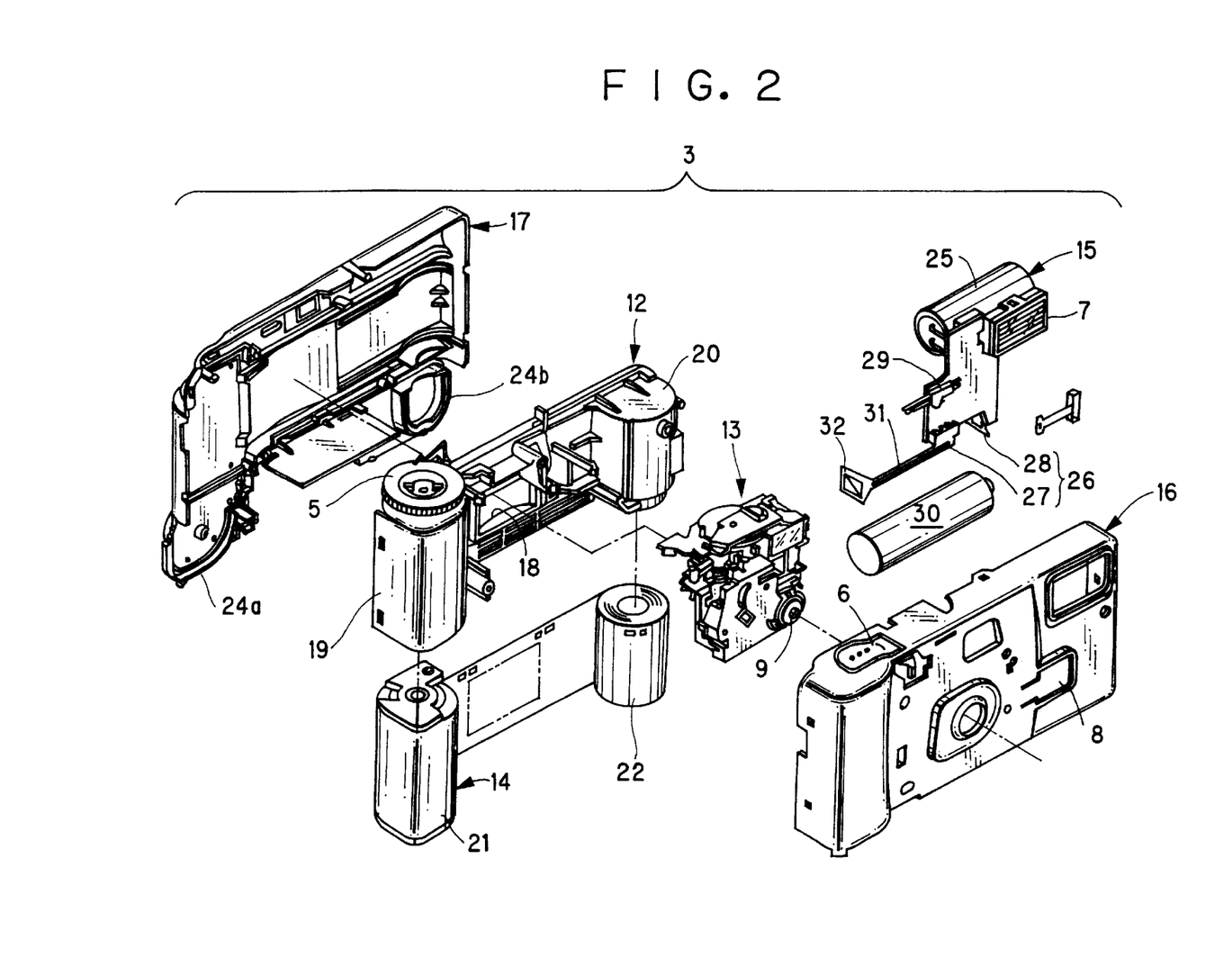
FIG. 2 is an exploded perspective illustrating the lens-fitted photo film unit.

In FIG. 2, the housing 3 is constituted by a main body 12, an exposure unit 13, a photo film cassette 14, a flash circuit board 15, a front cover 16 and a rear cover 17. The main body 12, the exposure unit 13, the front cover 16 and the rear cover 17 are formed respectively from resin.

A light-shielding tunnel 18 is disposed in the center of the main body 12. There are a cassette holder chamber 19 and a roll holder chamber 20 between which the light-shielding tunnel 18 is located, and each of which protrudes to the front in a semi-cylindrical shape. The cassette holder chamber 19 contains a cassette 21 of the photo film cassette 14. The roll holder chamber 20 contains a photo film 22 drawn from the cassette 21 and wound again in a roll shape. The rear cover 17 is retained on the rear of the main body 12, and covers the rear of the cassette holder chamber 19 and the roll holder chamber 20. Bottom openings of the cassette holder chamber 19 and the roll holder chamber 20 are closed in a light-tight manner by bottom lids 24a and 24b formed with the rear cover 17.

The exposure unit 13 includes the taking lens 9, a photo film wind-blocking mechanism and a shutter mechanism, and is retained on the front of the light-shielding tunnel 18 by use of engagement of claws. The flash circuit board 15 is retained on an outer face of the roll holder chamber 20 by use of engagement of claws. The exposure unit 13 and the flash circuit board 15 are covered by the front cover 16, which is retained on the front of the main body 12 by use of engagement of claws.

A circuit pattern is printed on the front face of a board part of the flash circuit board 15, and constitutes a flash circuit. The flash emitter 7 is mounted in a gap formed in the right-hand upper corner of the flash circuit board 15. A main capacitor 25 is disposed in a position behind the flash emitter 7, and laid horizontally.

A battery holder 26 is constituted by a pair of battery contact parts 27 and 28, which are located on the bottom of the board part of the flash circuit board 15. An emission switch 29 is positioned above the battery contact part 27. Those parts are soldered to the circuit pattern at solder lands on the board part of the flash circuit board 15. A dry battery 30 of the UM-3 type is held in the battery holder 26 as a power source of the flash circuit.

An arm portion 31 is included in the battery contact part 27, and extends horizontally in parallel with the board part of the flash circuit board 15. A contact end portion 32 is disposed on the arm portion 31 by bending the piece for the battery contact part 27, has a trapezoidal shape, and is located near to the cassette holder chamber 19. The battery contact part 28 is located near to the roll holder chamber 20. The battery 30 has positive and negative terminals. A protruding end of the positive terminal is inserted in an end opening 28a of the battery contact part 28. The negative terminal is positioned on the contact end portion 32, and held by resiliency of the battery contact parts 27 and 28. Thus the battery 30 is kept laid horizontally under the light-shielding tunnel 18.

Figure 3:
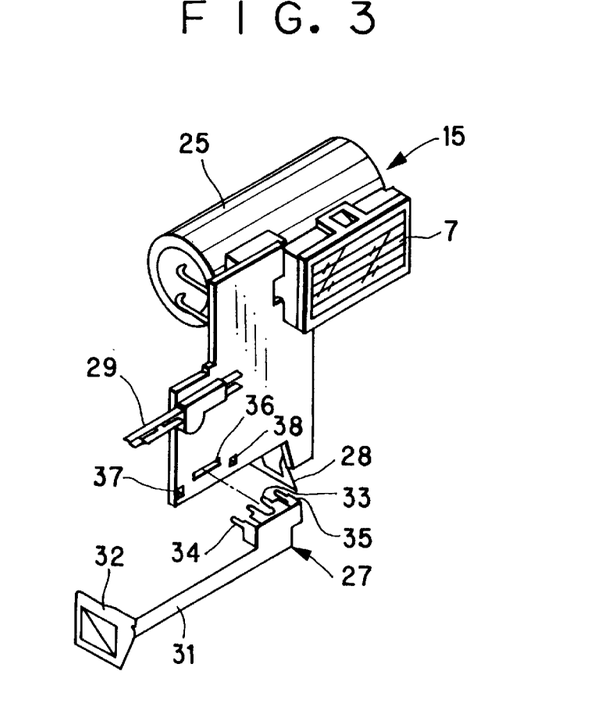
FIG. 3 is an exploded perspective illustrating a flash circuit board.

In FIG. 3, the remaining end of the arm portion 31 of the battery contact part 27 has an end region of a rectangular quadrilateral extending horizontally. Insertion projections 33, 34 and 35 are formed to protrude from a top edge and lateral ends of the rectangular quadrilateral end region by bending the piece for the battery contact part 27. Insertion holes 36, 37 and 38 are formed in the flash circuit board 15 in positions for receiving the insertion projections 33-35. The insertion projections 33–35 determine the position of the battery contact part 27 by insertion into the insertion holes 36–38 in the flash circuit board 15.

Figure 4A:
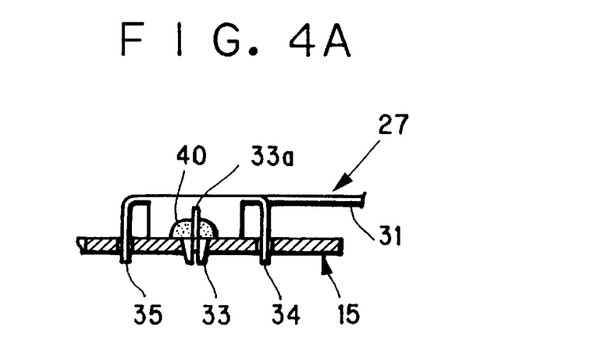
FIG. 4A is a top plan, partially cutaway, illustrating a soldered state of a battery contact part to a board part of the circuit board.
Figure 4B:
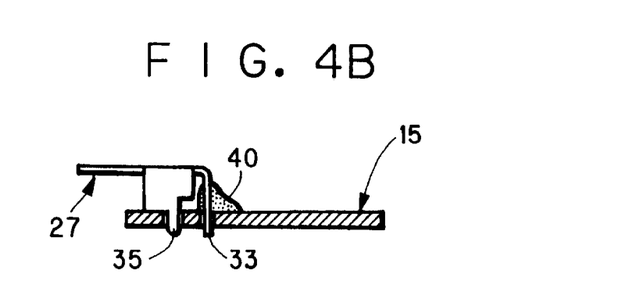
FIG. 4B is a side elevation, partially cutaway, illustrating the same as FIG. 4A.

In FIGS. 4A and 4B, solder 40 is placed between the insertion projection 33 and the inside of the insertion hole 36 to attach the battery contact part 27 to the board part of the flash circuit board 15. A slit 33a is formed in the center of the insertion projection 33, and receives a small part of the solder 40.

In taking a photograph with the lens-fitted photo film unit 2, at first the winder wheel 5 is rotated to set a frame of the photo film and charge the shutter device. Then the shutter release button 6 is depressed while a photographic object is observed through the viewfinder 10. A blade of the shutter mechanism is actuated to expose the photo film 22.

For the flash photography, the charger button 8 is depressed before releasing operation, to start charging to the main capacitor 25. When the main capacitor 25 is charged by a predetermined amount, the shutter release button 6 is depressed. Then the shutter blade is actuated. The two metal plate segments of the emission switch 29 contact each other, to cause the flash emitter 7 to emit flash light.

Exposures are taken to the photo film 22, the entirety of which is wound into the cassette 21. The lens-fitted photo film unit being used is forwarded to a photo laboratory. In a photofinishing operation, the bottom lid 24a of the cassette holder chamber 19 is opened to remove the photo film cassette 14 with the exposed photo film 22 from the cassette holder chamber 19.

The lens-fitted photo film unit 2, from which the photo film cassette 14 has been removed, is withdrawn by the manufacturer, and disassembled into the parts. The front cover 16, the rear cover 17 and the main body 12 are pelleted, and regenerated as raw material to be reused for new parts of resin. The exposure unit 13 is subjected to inspection of appearance and performance. Some of the parts of the exposure unit 13 are renewed, such as a shutter-driving spring, a wind-blocking lever, the taking lens 9 and the like. Then the exposure unit 13 is transferred to an assembly line of lens-fitted photo film units, to be reused.

The flash circuit board 15, after the battery 30 is removed, is subjected to inspection of the appearance and performance. The flash circuit board 15 detected acceptable is transferred to the assembly line of lens-fitted photo film units. A new dry battery 30 is mounted into the battery holder 26, to reuse the flash circuit board 15. If the flash circuit board 15 is detected unacceptable, the flash circuit board 15 is transferred to a reconstructing line.

It is to be noted that the battery contact part 27 has a smaller thickness than that of the battery contact part 28. This is for the purpose of reducing a back-to-front thickness of the lens-fitted photo film unit 2, and also keeping resiliency for good removability of the battery 30. In the course of removal of the battery 30, it is likely that the arm portion 31 is deformed considerably, to cause failure in mounting of another dry battery 30. In view of this, a part exchanging apparatus 50 in the reconstructing line is used, to which the flash circuit board 15 with the battery contact part 27 deformed is transferred for the purpose of recycling the flash circuit board 15. See FIGS. 5A and 5B.

Figure 5A:
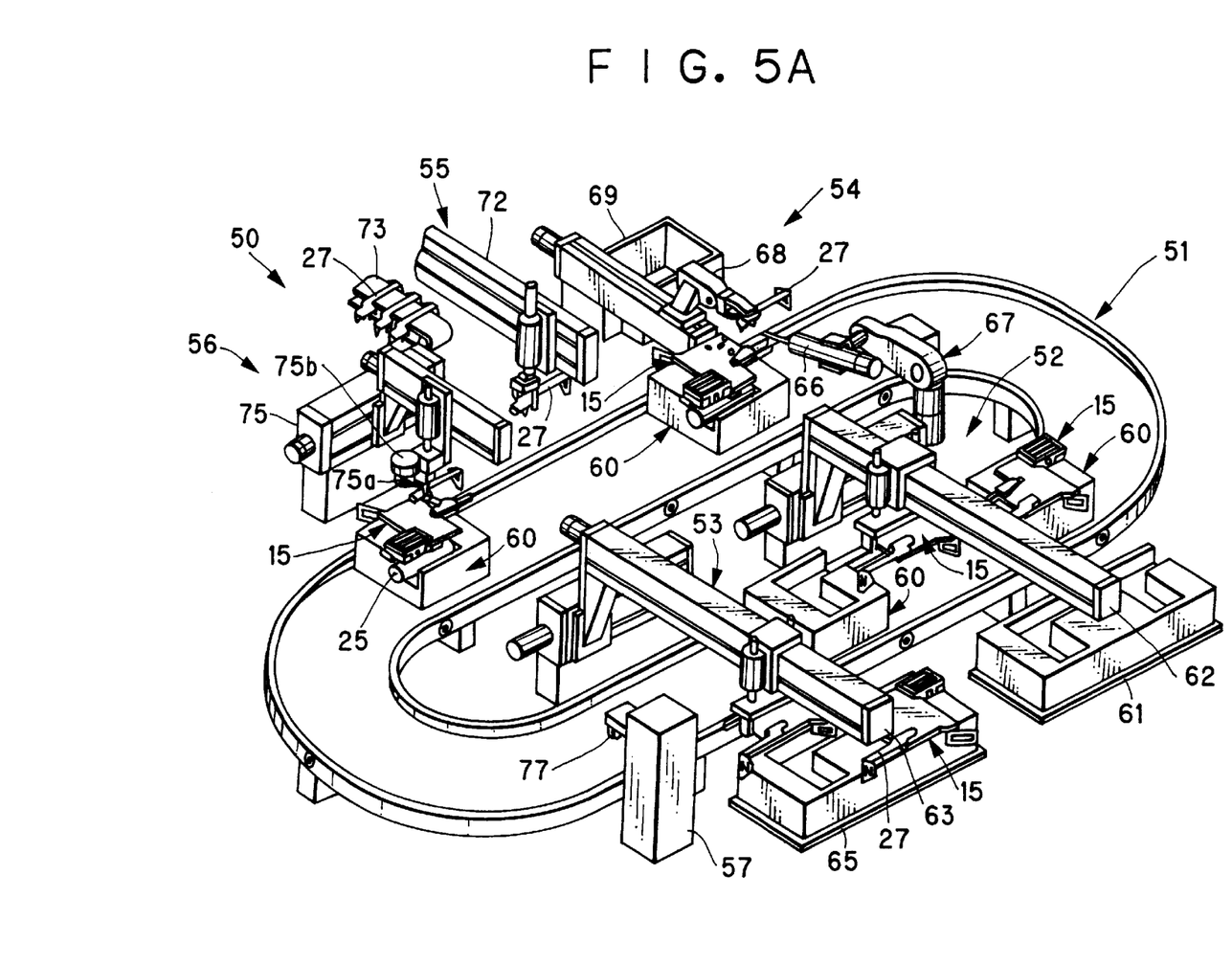
FIG. 5A is a perspective illustrating a part exchanging apparatus of the present invention.
Figure 5B:
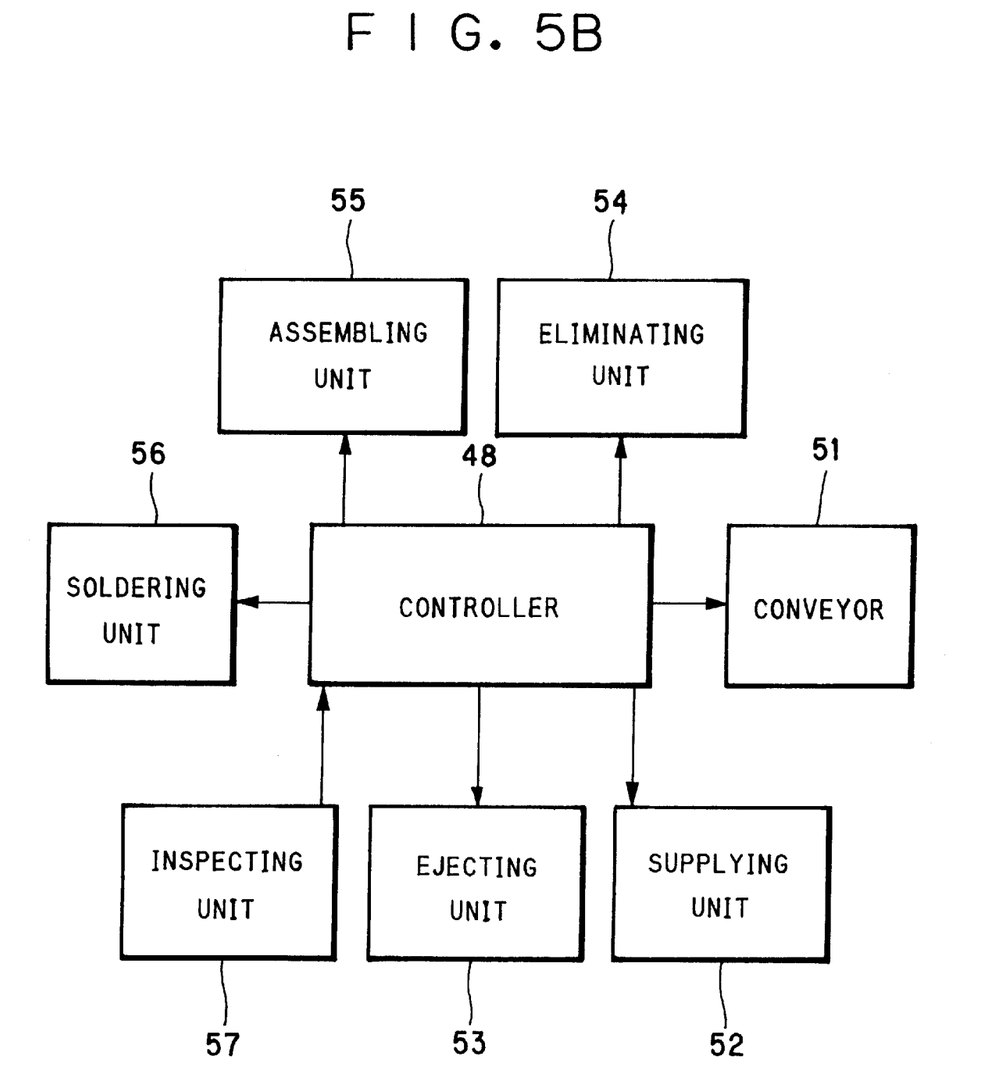
FIG. 5B is a block diagram illustrating the part exchanging apparatus.

In FIGS. 5A and 5B, the part exchanging apparatus 50 is constituted by an endless track conveyor 51 having a loop-shaped track, and includes a supplying unit 52, an ejecting unit 53, an eliminating unit 54, an assembling unit 55, a soldering unit 56 and an inspecting unit 57, all of which are disposed along a track of the endless track conveyor 51.

The endless track conveyor 51 is provided with a plurality of board holders 60 or pallets respectively for supporting the flash circuit board 15. The board holders 60 are circulated in the loop-shaped track of the endless track conveyor 51. Each of the board holders 60 keeps one circuit board 15 positioned in an orientation of directing the battery contact part 27 outwards in relation to the loop-shaped track. The endless track conveyor 51 operates to convey the flash circuit board 15 to the eliminating unit 54, the assembling unit 55 and then the soldering unit 56 together with each of the board holders 60.

A controller 48 in FIG. 5B controls conveyance of the board holders 60. The board holders 60 are caused by the controller 48 to move intermittently and stopped at the units for the part exchange, inspection, supply and withdrawal, but not at the inspecting unit 57. A top face of the board holders 60 has a recess for receiving rear protruding portions of the flash circuit board 15, such as the main capacitor 25. The flash circuit board 15 is kept extended horizontally with the front face of the printed circuit pattern directed upwards.

The supplying unit 52 includes a supply robot 62, which removes the flash circuit board 15 from a pallet 61 before the exchange of the battery contact part 27, and places the flash circuit board 15 on the board holder 60 in the unoccupied state. The pallet 61 has been moved from a circuit board inspection line to the supplying unit 52. The flash circuit board 15 is placed on the pallet 61 in the circuit board inspection line, and transferred by the pallet 61 to the supplying unit 52.

The ejecting unit 53 includes an ejection robot 63, which ejects the flash circuit board 15 including the new battery contact part 27. A pallet 65 is disposed to receive the flash circuit board 15 removed from the board holder 60, and is ready to move to the assembly line.

The eliminating unit 54 includes a melter robot 67, a shifter robot arm 68 or robot hand, and a receptacle 69. The melter robot 67 has a hot air heater 66 for blowing with hot air to the solder 40 in connection between the battery contact part 27 and the board part of the flash circuit board 15. The shifter robot arm 68 captures the battery contact part 27 while the solder 40 is melted, and removes the battery contact part 27 from the board part. The receptacle 69 receives the battery contact part 27 removed by the shifter robot arm 68.

The assembling unit 55 is constituted by an assembly robot 72 and a supply conveyor 73. The assembly robot 72 mounts the new battery contact part 27 on to the board part of the flash circuit board 15 from which the battery contact part 27 has been removed. The supply conveyor 73 supplies the assembly robot 72 with the battery contact part 27. Plural battery contact parts 27 are arranged in line by a hopper device (not shown), and disposed on the supply conveyor 73. The assembly robot 72 captures the foremost one of the battery contact part 27.

A soldering robot 75 constitutes the soldering unit 56 to solder the flash circuit board 15 with the battery contact part 27 newly placed by the supplying unit 52. The soldering robot 75 has a soldering iron 75a and a solder cartridge 75b.

The solder cartridge 75b contains a roll of solder wire. The soldering iron 75a is automatically supplied with the solder wire by the solder cartridge 75b. If all the solder wire is used up, the solder cartridge 75b is replaced with an unused solder cartridge.

A contact plate 77 is disposed in the inspecting unit 57 for being depressed by contacting the flash circuit board 15 in the course of movement of the flash circuit board 15 past the inspecting unit 57. An amount of depression of the contact plate 77 is checked to detect the amount of looseness with which the battery contact part 27 is mounted in an upwards projecting state on the board part of the flash circuit board 15.

When the pallet 61 from the inspection line for the flash circuit board 15 is stopped in a predetermined position, the supply robot 62 stands by on the loop-shaped track while grasping the flash circuit board 15 removed from the pallet 61. The supply robot 62 mounts the flash circuit board 15 on the board holder 60, which has been unoccupied and positioned in the supplying unit 52 provisionally.

Figure 6A:
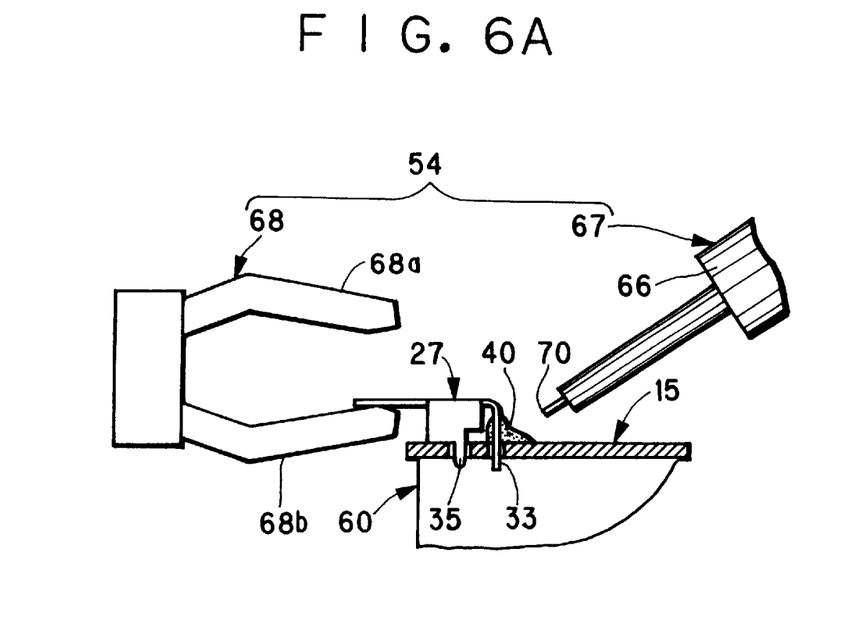
FIG. 6A is an explanatory view in elevation, illustrating a ready state of a shifter robot arm of an eliminating unit with the circuit board.
Figure 6B:
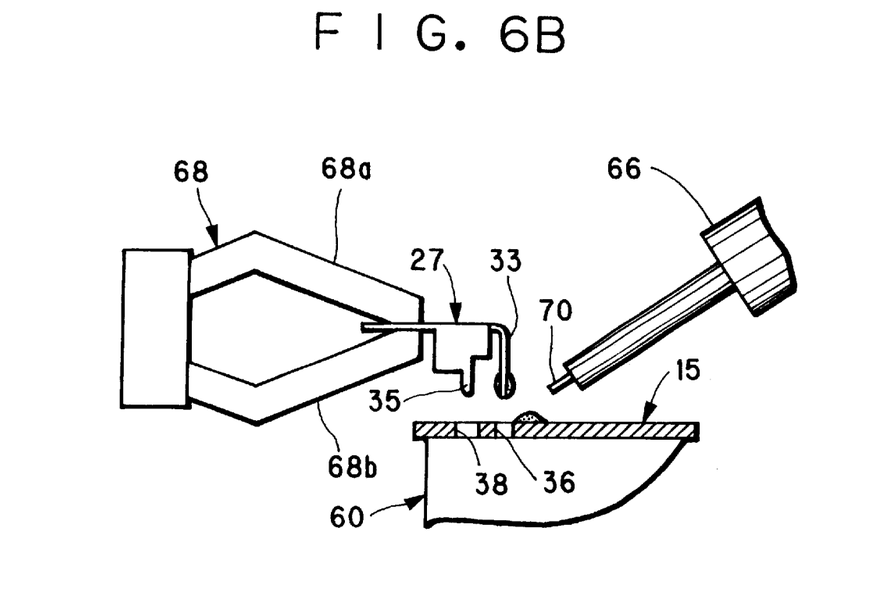
FIG. 6B is an explanatory view in elevation, illustrating an operating state of the shifter robot arm of the eliminating unit with the circuit board.

The board holder 60 with the flash circuit board 15 is transferred to the eliminating unit 54, and stopped temporarily in a predetermined position. In FIGS. 6A and 6B, an air outlet 70 of the hot air heater 66 is directed to the center of the solder 40 connecting the battery contact part 27 and the board part of the flash circuit board 15 while the board holder 60 is stopped. The shifter robot arm 68 is moved to the battery contact part 27. A capturing claw 68a of the shifter robot arm 68 comes to a position above the battery contact part 27. A capturing claw 68b is inserted between the flash circuit board 15 and the battery contact part 27 in a direction toward the insertion projection 33.

The hot air heater 66 causes hot air to flow through the air outlet 70 toward the solder 40, which is heated and melted. The air outlet 70 has a size smaller than an area of the solder 40. Thus the hot air is applied only to the solder 40, which can be melted with much efficiency.

The capturing claws 68a and 68b of the shifter robot arm 68 grasp the battery contact part 27 as the capturing claw 68b lifts the battery contact part 27 directly in a vertical direction. Thus the insertion projections 33–35 are pulled out of the insertion holes 36–38. The battery contact part 27 is eliminated from the flash circuit board 15. Note that there is constantly preheating operation for the hot air heater 66 to give off hot air instantaneously. It is possible to apply heat by blowing with hot air immediately upon the stop of the board holder 60.

The battery contact part 27 is lifted while hot air is applied to the center of the solder 40. A regular small amount of solder remains on the flash circuit board 15 while another part of the solder 40 remains in the slit 33a of the insertion projection 33. The regular small amount of the solder makes it possible to simplify the soldering process by eliminating a step of placing additional solder on the flash circuit board 15 for resoldering the battery contact part 27.

The battery contact part 27 being removed is shifted by the shifter robot arm 68 and entered into the receptacle 69. The battery contact part 27 collected in the receptacle 69 is regenerated as raw material, and is recycled for new metal parts.

The board holder 60 and the board part of the flash circuit board 15 without the battery contact part 27 is transferred to the assembling unit 55, and stopped provisionally in a predetermined position. The assembly robot 72 is ready on the track while holding a new battery contact part 27, which is placed on the board part of the flash circuit board 15 being stopped. The insertion projections 33–35 are inserted into the insertion holes 36–38, to position the battery contact part 27 temporarily.

The board holder 60 with the flash circuit board 15, on which the new battery contact part 27 is positioned, is transferred to the soldering unit 56 and stopped temporarily in a predetermined position. The soldering robot 75 moves the soldering iron 75a to the insertion projection 33, to solder the battery contact part 27 to the board part, to obtain a reconstructed flash circuit board 15.

Each time that the flash circuit board 15 on the board holder 60 with the unused battery contact part 27 passes the inspecting unit 57, the contact plate 77 contacts the flash circuit board 15 to inspect whether the battery contact part 27 is loosely mounted in an upwards projecting state. If the flash circuit board 15 is detected acceptable in a fixedly attached state, the board holder 60 with the flash circuit board 15 is transferred to the ejecting unit 53, and stopped in a predetermined position temporarily. The flash circuit board 15 is removed by the ejection robot 63 from the board holder 60, and placed to the pallet 65.

The reconstructed flash circuit board 15 on the pallet 65 is transferred to the assembly line, where the flash circuit board 15 is mounted on the new main body 12 to be reused. The board holder 60, from which the flash circuit board 15 is removed, is conveyed by the endless track conveyor 51 to the supplying unit 52. The flash circuit board 15, if detected unacceptable by the inspecting unit 57, is not withdrawn by the ejection robot 63, but is conveyed to the eliminating unit 54 by the endless track conveyor 51. Again, the battery contact part 27 of the flash circuit board 15 is replaced with a new one in the same process as described above.

As described heretofore, the operation of the supply and withdrawal of the flash circuit board 15 is effected automatically by use of the endless track conveyor 51, the supplying unit 52 and the ejecting unit 53. It is possible to reduce the total of laborious manual operation to what is required for an overall administration of the apparatus. Thus the manual operation for the exchange of the part can be much easier.

In the above embodiment, hot air is applied to the center of the solder connecting the battery contact part and the board part, so that a regular small amount of the solder remains on the flash circuit board 15 while another part of the solder 40 remains in the slit 33a of the insertion projection 33. However hot air may be applied to a position under the center of the solder or on a surface of the board part. The entirety of the solder may remain with the battery contact part, and may be neatly removed from the board part.

In the above embodiment, the solder of the partial amount remains on the board part after the elimination of the battery contact part, and is usable again for the attachment. Thus the solder cartridge 75b may be eliminated, because no additional solder may be supplied.

In the above embodiment, the eliminating unit includes the hot air heater. Instead an eliminating unit may have a combination of a soldering iron and a suction device. The soldering iron may melt the solder, before the suction device may suck and eliminate the melted solder. In the above embodiment, the soldering unit includes the soldering iron. Instead a soldering unit may have a combination of a hot air heater and a solder cartridge. Solder wire may be supplied by the solder cartridge. Hot air heater may apply hot air to the solder wire, so as to solder the battery contact part to the board part.

In the above embodiment, the endless track conveyor 51 is used. Of course any type of conveyor can be used, for example, an indexing table which is shaped circularly and rotatable, a live roller conveyor having a great number of rollers rotating in synchronism, a pallet conveyor inclusive of the board holders as pallets, a car type of conveyor inclusive of the board holders as cars, and any suitable conveyor in which the board holder 60 can be conveyed along a track with a shape of a closed loop.

Furthermore, two conveyors with paths of a simple straight type, such as belt conveyors and chain conveyors, can be used, and arranged in parallel and driven in direction reverse to each other, with necessary addition of manual operation or auxiliary robot hands for transferring the board part of the circuit board with each board holder from one conveyor to the another.

In the above embodiment, the one sequence of the exchange of the battery contact part 27 is effected in the course of one cyclic operation of the endless track conveyor 51. Furthermore it is possible to effect plural sequences of the exchange of the battery contact part 27 in the course of one cyclic operation of the endless track conveyor 51.

Also the conveyor of the part exchanging apparatus can be an extended portion of a conveyor of an inspection line or assembly line for the circuit board. Furthermore, the conveyor of the part exchanging apparatus may be provided with a positioning robot arm or robot hand for keeping the flash circuit board 15 positioned. In addition, the conveyor may be eliminated from the part exchanging apparatus, for which manual operation may be added for supplying the circuit board for the eliminating, assembling and soldering units. This is effective in lowering cost required for constructing the part exchanging apparatus.

It is also possible to dispose the eliminating unit, the assembling unit and the soldering unit in a manner traveling along a loop-shaped track in a controlled manner. Those units may be moved relative to the circuit board positioned in a stationary manner, so as to exchange the battery contact part automatically.

In the above embodiment, the assembling unit 55 is disposed downstream from the eliminating unit 54. The soldering unit 56 is disposed downstream from the assembling unit 55. Alternatively the eliminating unit 54 and the assembling unit 55 may be disposed in the same station relative to the conveying path, and may be movable into and out of one space of the station alternately, to access the board part of the flash circuit board 15 successively. Furthermore, the assembling unit 55 and the soldering unit 56 may be disposed in the same station, and may be movable into and out of one space of the station alternately, to access the board part successively.

In the above embodiment, the part exchanging apparatus is designed for exchanging the battery contact part of the flash circuit board incorporated in the lens-fitted photo film unit. Furthermore, a part exchanging apparatus of the present invention can be constructed for exchanging the main capacitor, the flash emitter, or any suitable soldered part of the flash circuit board, and also constructed for exchanging an electrical part of any device in the field of electricity that is soldered to another part of the device.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. An apparatus for exchanging parts connectable to a circuit board, said circuit board including a board part, and at least one first part connected to said board part by solder, said apparatus comprising:
   an eliminating unit for melting said solder, and for removing said first part from said board part while said solder is melted;
   an assembling unit for mounting a second part on said board part supplied from said eliminating unit, in order to substitute for said first part; and
   a soldering unit for connecting said second part to said board part supplied from said assembling unit by use of solder.

2. The apparatus as defined in claim 1, further comprising a conveyor for conveying said circuit board along a predetermined conveying path, wherein said eliminating unit, said assembling unit, and said soldering unit are arranged in sequence with reference to said conveying path.

3. The apparatus as defined in claim 2, wherein said conveying path is loop-shaped, and said conveyor moves said circuit board along said conveying path.

4. The apparatus defined in claim 3, further comprising:
   a supplying unit, disposed upstream from said eliminating unit with reference to said conveying path, for supplying said conveying path with said circuit board; and
   an ejecting unit, disposed downstream from said soldering unit with reference to said conveying path, for ejecting said board part and said second part soldered thereto from said conveying path.

5. The apparatus as defined in claim 4, further comprising a board holder on which said board part is mounted, and which is moved cyclically along said conveying path by said conveyor, wherein said first and second parts are removed or mounted while said board part is mounted on said board holder.

6. The apparatus as defined in claim 4, further comprising an inspecting unit, disposed between said soldering unit and said ejecting unit along said conveying path, for determining whether a mounted state between said board part and said second part is correctly connected.

7. The apparatus as defined in claim 6, wherein said inspection unit includes a contact element to determine whether the second part and the board part are fixedly connected to determine the mounted state.

8. The apparatus as defined in claim 7, further comprising a controller for controlling said conveyor and said ejecting unit in accordance with a determination by said inspecting unit, said controller driving said ejecting unit if said board part and said second part are fixedly connected, and inducing said ejecting unit to supply said eliminating unit with said circuit board if said board part and said second part are not fixedly connected.

9. The apparatus as defined in claim 8, wherein said circuit board is a flash circuit board of a lens-fitted photo film unit.

10. The apparatus as defined in claim 3, wherein said eliminating unit includes:
    a heater for melting said solder of said first part by application of heat; and
    a robot hand for gripping and removing said first part from said board part when said solder is melted.

11. The apparatus as defined in claim 10, wherein said heater is a hot air heater for applying hot air to said solder of said first part.

12. The apparatus as defined in claim 3, wherein said conveyor is an endless conveyor.

13. The apparatus of claim 1, wherein the eliminating unit melts the solder from a solid state to a liquid state.

14. The apparatus of claim 13, further comprising:
    an ejection unit, disposed downstream from said soldering unit to remove said board part and said second part soldered thereto from said apparatus; and
    an inspection unit disposed between said soldering unit and said ejection unit for determining whether a mounted state between said board part and said second part is correctly connected.

15. The apparatus of claim 14, further comprising a controller for providing said board part and said second part soldered thereto to said elimination unit when said board part and said second part are not correctly connected and providing said board part and said second part soldered thereto to said ejection unit when said board part and said second part are correctly connected.

16. The apparatus of claim 2, wherein said conveyor conveys said circuit board such that said eliminating unit and said assembling unit operate on an identical portion of said circuit board.

17. The apparatus of claim 6, wherein said conveyor does not stop as the circuit board passes the inspecting unit.

18. The apparatus of claim 17, wherein the inspecting unit determines an upward displacement of said second part from said circuit board, said inspecting unit using mechanical displacement for inspection.

\* \* \* \* \*